United States Patent [19]

Fish

[11] 4,437,094
[45] Mar. 13, 1984

[54] SYSTEM FOR CONTROLLING INDICATORS FOR SWITCHES

[75] Inventor: Joe W. Fish, Cherry Hill, N.J.

[73] Assignee: RCA Corporation, New York, N.Y.

[21] Appl. No.: 311,513

[22] Filed: Oct. 15, 1981

[51] Int. Cl.³ .......................... H04Q 9/00; G08B 21/00
[52] U.S. Cl. .............................. 340/825.5; 340/825.22; 340/365 E; 340/644
[58] Field of Search .............. 340/825, 825.22, 825.17, 340/365 E, 825.5, 644; 307/115, 125

[56] References Cited

U.S. PATENT DOCUMENTS

| | | | |
|---|---|---|---|
| 3,483,553 | 12/1969 | Blankenbaker | 340/365 E |
| 3,765,015 | 10/1973 | Gruner | 340/365 E |
| 3,893,083 | 7/1975 | Teramura et al. | 340/172.5 |
| 3,986,039 | 10/1976 | Bovitz | 340/365 E |
| 4,287,939 | 9/1981 | Pohl et al. | 340/825.22 |
| 4,350,972 | 9/1982 | Perry | 340/825 |

Primary Examiner—Donald J. Yusko
Attorney, Agent, or Firm—J. S. Tripoli; R. L. Troike; C. L. Maginniss

[57] ABSTRACT

A circuit coupled between an indicating pushbutton panel switch and a software-programmable processor permits program control over the effect of switch actuation and over the illumination of the indicators. The processor can disable the switch function, blanking the indicators; it can accept a manual actuation of the switch, changing the illumination; it can reject as invalid a switch actuation within a multiple-switch field, retaining the current illumination; and it can alter the illumination in the absence of switch actuation. In one embodiment the signals providing the switch and indicator status are channeled into a serial data stream and transferred to the processor input register.

14 Claims, 5 Drawing Figures

SYSTEM FOR CONTROLLING INDICATORS FOR SWITCHES

The Government has rights in this invention pursuant to Contract No. DAAK40-78-C-0213 awarded by the Department of the Army.

The present invention relates to an interface between switches and their indicators.

It is often desirable for some amount of system-based control to be exercised over the occurrence of an event in response to the manual actuation of a console switch. This is especially true in a complex panel having a multiplicity of densely clustered pushbutton switches, such as a radar control panel. It is not uncommon for the operator of such a panel mistakenly to actuate two switches rather than one with a single push. In systems where the validity of the pushbutton actuation is not checked, both switch functions may be executed. In other systems the occurrence of the first actuation detected may lock out any actuation which would be detected an instant later. Neither one is satisfactory. The first is totally unacceptable in that it ensures that an incorrectly selected function will be processed. The second provides no assurance that the selected pushbutton function is the one intended by the operator. The only acceptable solution is to disregard simultaneous switch actuations in such a manner that the operator is aware that the actuations have not been acted upon.

Another shortcoming of many switch consoles is the lack of functional flexibility of the switches. It is often desirable to change, add or delete a switch function under particular operating environments. In conventional consoles this type of change usually requires hardware wiring alterations, which are costly and time-consuming.

In systems embodying the invention including a plurality of switches and an indicator associated with each switch, means are provided which are responsive to the actuation of only one of the switches for causing its associated indicator to change from a first to a second condition. Means are additionally provided which respond to the concurrent actuation of more than one of the switches for preventing their associated indicators from being changed in condition.

A system embodying the invention includes a logic circuit which controls the effect of actuation of a console switch. The circuit responds to switch actuation by reporting switch status to the input register of a process controller via one of several parallel-to-serial bus arrangements. The process controller responds to switch status data by executing the function associated with the actuated switch and returning a confirmation signal to the appropriate switch circuit which enables the driver of an indicator, such as a lamp, associated with the actuated switch. One state of a storage register associated with each switch logic circuit inhibits the operation of the switch actuation circuit; the state of the inhibit register is under the control of the process controller.

Figure 1:
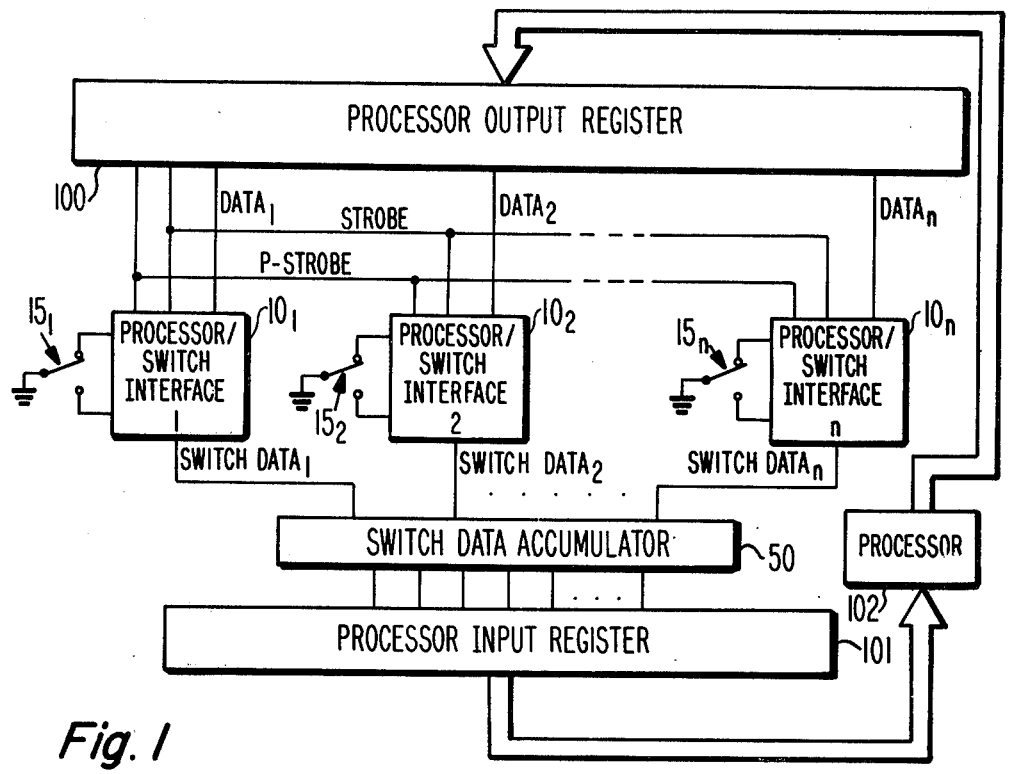
FIG. 1 is a block diagram of the preferred embodiment of the present invention.

Referring to FIG. 1, switches $15_1, 15_2, \ldots, 15_n$ represent the contacts of a multiplicity of panel switches; by way of example, a particular type of panel switch having a single momentary action contact will be discussed. While not illustrated, the switch may have a top surface which is oriented substantially flush with the panel, and may accommodate two lamps which provide two different colors for backlighting the top surface. One example of this type of switch is Model No. 99-214 sold by Aerospace Optics, Inc., Fort Worth, Texas. In many panel applications using this or a similar type of switch, actuation of the switch is directly coupled to the execution of a selected function and a change in the lamp illumination. However, in the present system there is a processor/switch interface which causes a change in illumination and execution of the selected function to be accomplished only after confirmation of the manual switch actuation by the processor and that only after the processor has had the opportunity to determine whether the switch actuation was validly performed. Following validity confirmation, function execution is initiated by processor generation and transmission of an appropriate operation code to the affected components of the system.

Figure 2:
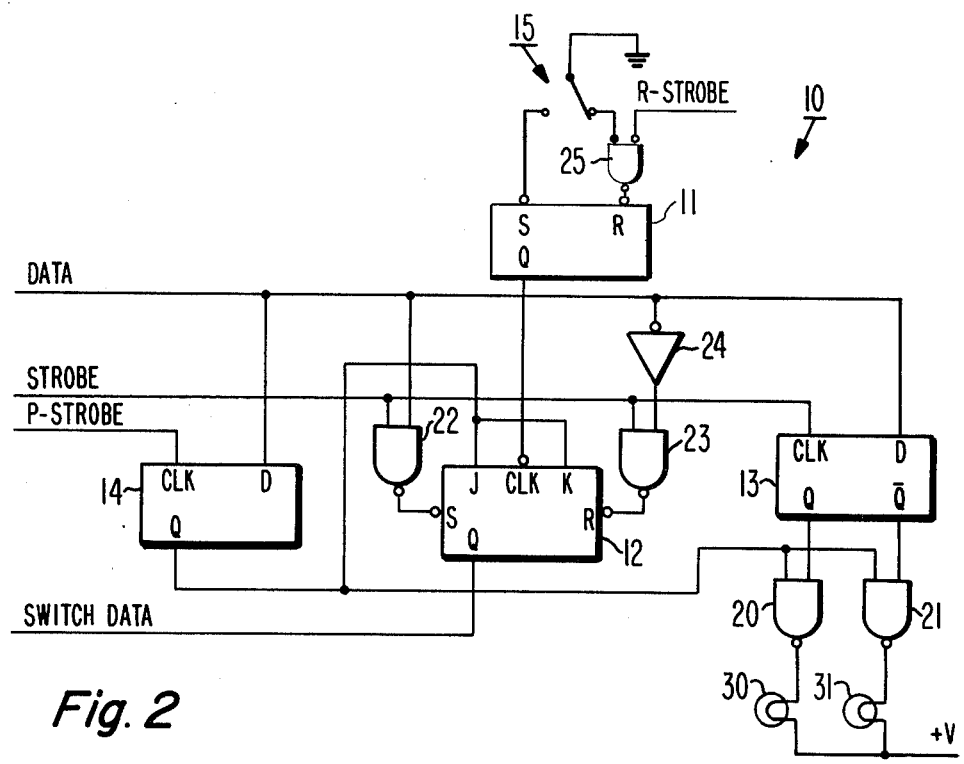
FIG. 2 is a logic diagram of the processor/switch interface of the embodiment of FIG. 1.

Switches $15_1, 15_2, \ldots, 15_n$ are coupled to a corresponding group of processor/switch interface circuits $10_1, 10_2, \ldots, 10_n$, referred to collectively as processor/switch interface circuits 10, which will be described in more detail in connection with FIG. 2. Three signals generated by processor output register 100 are coupled to each processor/switch interface circuit $10_1, 10_2, \ldots, 10_n$. One is a DATA signal which is individually provided to each interface circuit 10 in the group comprising n interface circuits 10. The remaining two signals are strobes, STROBE and P-STROBE, which are used to clock the DATA signals into the group of interface circuits 10. The strobe signals are common to all of the processor/switch interface circuits 10 shown in FIG. 1. STROBE is the operational signal and P-STROBE is used to clock the data during the initial set-up. A switch console may comprise more than one group of processor/switch interface circuits 10, each group using the several DATA signals in common, while having unique STROBE and P-STROBE signals. One additional signal, R-STROBE, not shown in FIG. 1 but discussed in connection with FIG. 2, is common to all processor/switch interfaces 10 and relates to the timing of the signals generated by each switch 15 with respect to the STROBE signal.

The processor/switch interface circuit 10 output signals, SWITCH DATA$_1$, SWITCH DATA$_2$ ..., SWITCH DATA$_n$, represent a multiplicity of signals which are combined in the switch data accumulator 50 to provide a smaller number of signals to be applied to the processor input register 101. Three embodiments of switch data accumulator 50 will be discussed in detail in connection with FIGS. 3a, 3b, and 3c. It will be noted there that switch data accumulator 50 may be physically divided into two portions, one located with the panel logic and the other with the processor logic, in order to minimize the number of signals in the panel/processor interface.

Processor 102 reads the data at its input register 101, acts on that data, and responds with the appropriate signals at its output register 100. In the system incorporating the present invention, one task of processor 102 is the determination of which switches 15 were actuated, by noting corresponding occurrences of the SWITCH DATA signals. Upon concurrent actuation of more than one switch 15 within an exclusive group, i.e., a predetermined group of switches for which actuation of more than one switch is deemed improper, processor 102 responds by rejecting all such actuations, restoring the corresponding processor/switch interface circuits 10 to their previous states in readiness for a proper actuation of one switch within that exclusive group. Concurrent actuation refers to the actuation of more than one switch within a predetermined short period of time.

The switch/processor interface of the present invention, when incorporated as the control logic in a switch panel similar to the type described above, is capable of providing four distinct functions:

(a) it can implement a processor-initiated disable of the switch function and indicator illumination or, conversely, a processor-initiated enable of previously disabled switch and indicator functions;

(b) it can implement the processor acceptance of a manual actuation of the switch, changing the illumination of the indicator and initiating the execution of the selected function;

(c) it can implement the processor rejection of a manual actuation of the switch, preventing the execution of the selected function and retaining the present indicator illumination; and (d) it can implement a processor-initiated selection of the indicator illumination and the switch data output. This last-mentioned function may be a response to a processor-initiated activation of the switch function, in which case the switch data output and the indicator illumination must be placed in the proper state immediately following activation, or it may be a response to a system requirement calling for a change of switch data output, exclusive of any manual operation.

Additionally, the system which incorporates the present invention provides the following advantages not found in conventional console systems:

(a) the function of any switch may be altered merely by software alterations (and the appropriate change of the switch legend), without any hardware alterations;

(b) the processor may test the processor/switch interface and the switch data accumulator by utilizing its ability to select the state of the switch data output.

The logic circuitry described in this disclosure is of a type similar to the 74LS family of logic elements sold by, for example, National Semiconductor Corp., Santa Clara, California. The elements of this logic family typically operate between sources of potential of +5.0 volts and ground, having a first signal level of approximately 3.5 volts which is referred to as a "high" signal level, or a logic "1" and a second level between 0 volts and approximately 0.8 volts which is referred to as a "low" signal level, or a logic "0".

Referring to FIG. 2, switch 15 is a momentary action single pole double throw switch. The normally-open contact is connected to the set input (S) of flip-flop 11, the normally-closed contact is coupled through OR gate 25 to the reset input (R) of flip-flop 11, and the common contact is connected to ground. Flip-flop 11 is a set-reset flip-flop of a type similar to 74LS279; alternatively, it can be built by cross-coupling two MAND gates in a manner well-known in the art. Flip-flop 11 assumes a set state (defined as a high voltage level at its Q output terminal) in response to a low voltage signal (shown as ground in FIG. 1) at its set (S) input terminal, and reset state (defined as a low voltage signal at its Q output terminal) in response to a low voltage signal at its reset (R) input terminal. Flip-flop 11 remains in its current state until an enabling signal causes it to change to the opposite state. Thus, it can be seen that an actuation of switch 15, in which switch 15 is depressed and released, will first cause an enabling signal at the S input terminal of flip-flop 11, then an enabling signal at the R input terminal, resulting in a positive signal pulse representing a logic 1 at the Q output terminal. Gate 25 is of a type similar to 74LS32. It delays the resetting of flip-flop 11 until R-STROBE is in a logic 0 state.

Flip-flop 12 is of a type similar to 74LS112 having clocked J-K inputs and having direct set (S) and reset (R) inputs. In the clocked mode, the state of the flip-flop is determined by the polarity of the signals applied to the J and K input terminals when the signal applied to the clock (CLK) input terminal makes a negative-going transition, i.e., from a logic 1 to a logic 0. In the circuit of the present invention, the J and K input terminals are electrically connected. In this case, a logic 1 signal on the J and K inputs causes the state of flip-flop 13 to change in response to a negative-going clock transition, and a logic 0 signal on the J and K inputs causes flip-flop 12 to remain in its current state following a negative-going clock transition. The signals at the direct set (S) and direct reset (R) input terminals function in flip-flop 12 as they do in flip-flop 11. They affect the output state of flip-flop 12 irrespective of the logic level of the signal at the CLK input. NAND gates 22 and 23, the output terminals of which are electrically connected to the S and R input terminals, respectively, of flip-flop 12, each have two input terminals. When the signals at both of the input terminals of gate 22 are in logic 1 state, the signal at the output terminal of gate 22 is in a logic 0 state, causing flip-flop 12 to assume a set state, i.e., the signal at the Q output is at a high level. Similarly, when the signals at both of the input terminals of gate 23 are in logic 1 state, flip-flop 12 is reset, i.e., the signal at the Q output is at a low level.

Flip-flop 13 is a D-type flip-flop having clock (CLK) and data (D) input terminals and Q and $\overline{Q}$ output terminals. It is of a type similar to 74LS74 and responds to positive-going transitions of the signal applied to the CLK input by transferring the logic state of the signal applied at the D input terminal to the Q output terminal, and the inverse of that logic state to the $\overline{Q}$ output terminal. The signals at the Q and $\overline{Q}$ outputs of flip-flop 13 are applied, respectively, to input terminals of gates 20 and 21 which are high current drivers having NAND characteristics and an open collector output, similar to type UHP-407 sold by Sprague Electric Co., Worcester, Mass. Drivers 20 and 21 produce a logic 0 signal at their output terminals only when logic 1 signals are concurrently applied to both input terminals and produce a logic 1 output signal at other times. Lamps 30 and 31, coupled, respectively, between drivers 20 and 21 and a source of voltage +V, illuminate in response to current passing through them, which occurs when the signals at the output terminal of drivers 20 and 21, respectively, are at their logic 0 states. Flip-flop 14 is a D-type flip-flop similar to flip-flop 13.

The interconnections of processor/switch interface circuit 10 with switch 15 and lamps 30 and 31 was discussed above. The interface with the processor consists of five signal lines. Referring to both FIGS. 1 and 2, the processor output register 100 provides a separate DATA signal of each of the n processor/switch interfaces 10, but the STROBE, R-STROBE and P-STROBE signals are common to all of the interface circuits 10 within the group of n which are illustrated. FIG. 2 shows that the DATA signal is applied to the D input of flip-flops 13 and 14, which are clocked, respectively, by STROBE and P-STROBE. Further, DATA is gated with STROBE to enable gate 22 and $\overline{\text{DATA}}$ (the inverse of the DATA signal which appears at the output terminal of inverter 24) is gated with STROBE to enable gate 23. SWITCH DATA, the signal generated at the Q output terminal of flip-flop 12, is combined with similar signals from other processor/switch interfaces 10 in switch data accumulator 50 (shown in FIG. 1), and the combined signals are applied to processor input register 101.

The operation of the processor/switch interface 10 of the present invention is as follows: the interface circuit 10 is initialized to either the active or disabled state by a processor generation of a P-STROBE with the appropriate logic level of the DATA signal. If the DATA signal is low during the occurrence of P-STROBE, flip-flop 14 resets, i.e., the signal at its Q output terminal is low, placing logic 0 signals at the inputs of drivers 20 and 21 and at the J and K inputs of flip-flop 12. Hence, neither lamp 30 or 31 can be illuminated, and the state of flip-flop 12 cannot be changed by the signal applied to the CLK input. If the DATA signal is high during the occurrence of the P-STROBE, flip-flop 14, sets, i.e., the signal at its Q output terminal is logic 1, priming drivers 20 and 21 and placing logic 1 signals at the J and K inputs of flip-flop 12. The reset state of flip-flop 14 disables processor/switch interface 10, and the set state activates it. Once the processor/switch interface 10 has been activated, processor output register 100 generates a STROBE signal with the appropriate logic level on the DATA signal to select the proper lamp 30 or 31 for illumination, and to place flip-flop 12 in the correct initial state, and thereby set the SWITCH DATA signal to the desired initial logic level.

Once flip-flop 14 has been set, i.e., processor/switch interface 10 has been enabled, an actuation of switch 15 causes a positive signal pulse at the Q output of flip-flop 11. Flip-flop 11 acts as a switch bounce eliminator. Once the movable contact of switch 15 has made electrical contact with the normally-open contact, flip-flop 11 sets and does not reset until the movable contact has returned to the normally-closed position and the R-STROBE signal is logic 0. Momentary bounces from the normally-open or normally-closed position which do not make electrical contact with the other position, do not affect the state of flip-flop 11. R-STROBE is a negative pulse which occurs just after STROBE so that switch actuations are detected by the processor and are not lost by the occurrence of STROBE and DATA before the change in the SWITCH DATA signal is read by a scan routine.

The falling edge of the signal pulse at the Q output of flip-flop 11 triggers flip-flop 12 and, because the signal at both the J and K inputs is high, the signal at the Q output of flip-flop 12, SWITCH DATA, changes logic level. This change is detected by the processor which determines whether the switch actuation was valid. If so, that is, only one SWITCH DATA signal was generated from within an exclusive group of switches, it changes the logic level of the DATA line and generates a pulse on the STROBE line. This action has no effect on flip-flop 12, whose state was already changed by the actuation of switch 15, but it does alter the state of flip-flop 13, changing the illumination of the switch indicators 30 and 31. Concurrently, the processor generates and transmits an operation code which initiates the execution of the function selected by that valid actuation. If the processor determines that the change in logic state of SWITCH DATA was not valid, for example, the SWITCH DATA signal from more than one processor/switch interface 10 within an exclusive group changed logic level, it retains the previous logic level of the signal on the DATA line and generates a pulse on the STROBE line. This has the effect of returning each flip-flop 12, whose previous logic level is retained by the processor, to its previous state, but it has no effect on the illumination of the switch indicators 30 and 31. Since no valid switch actuation was sensed for that exclusive group, no operation code is generated. Hence, it can be seen that processor/switch interface 10 permits the processor to determine the validity of any switch actuation before the effect of that actuation takes place, and before any change of illumination occurs. As can be determined from the earlier discussion, the processor may also change the illumination of the indicators and the logic level of the signal on the SWITCH DATA line independent of manual switch actuation.

Operationally, the time sequence of the switch data interrogation by the processor is as follows: the processor enters a scan routine wherein the status of all SWITCH DATA signals is read into the processor input register. Once the processor has determined which, if any, changes in SWITCH DATA signals are valid, it issues a single pulse on the STROBE signal line with the appropriate signal levels on all of the DATA lines to effect the changes. The scan operation may take place as frequently as system requirements dictate. However, a rate between 5 and 10 scans per second will generally give the switch operator the impression of an instantaneous response to his actuation, without unduly burdening the processor availability.

Figure 3A:
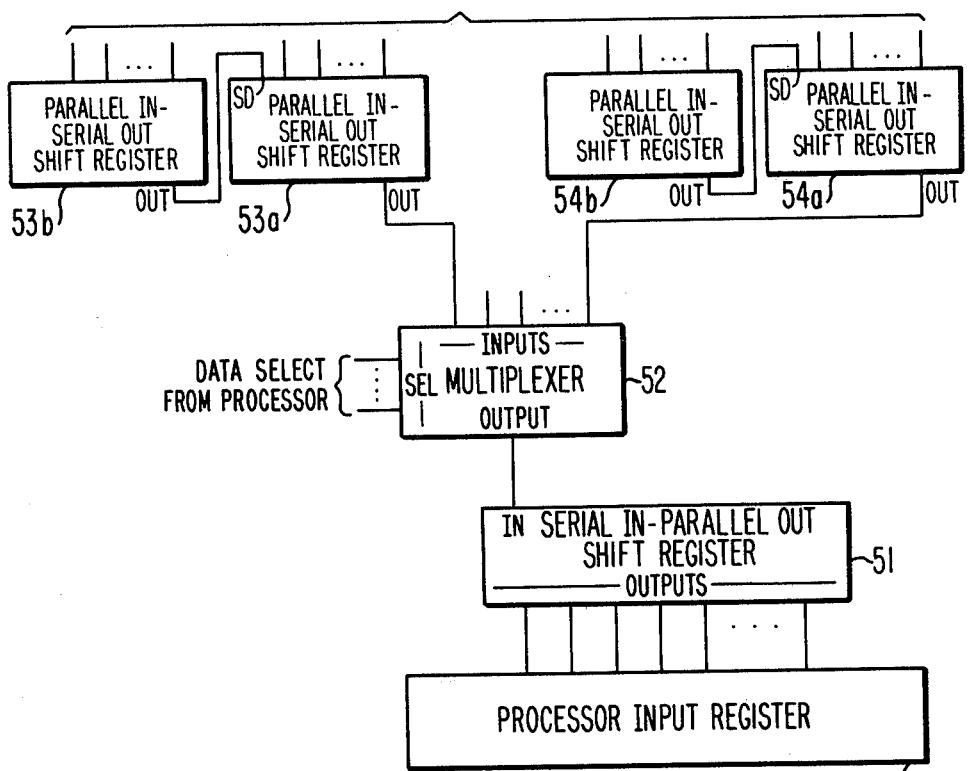
FIG. 3a is a detailed block diagram of a first embodiment of the switch data accumulator of FIG. 1.
Figure 3B:
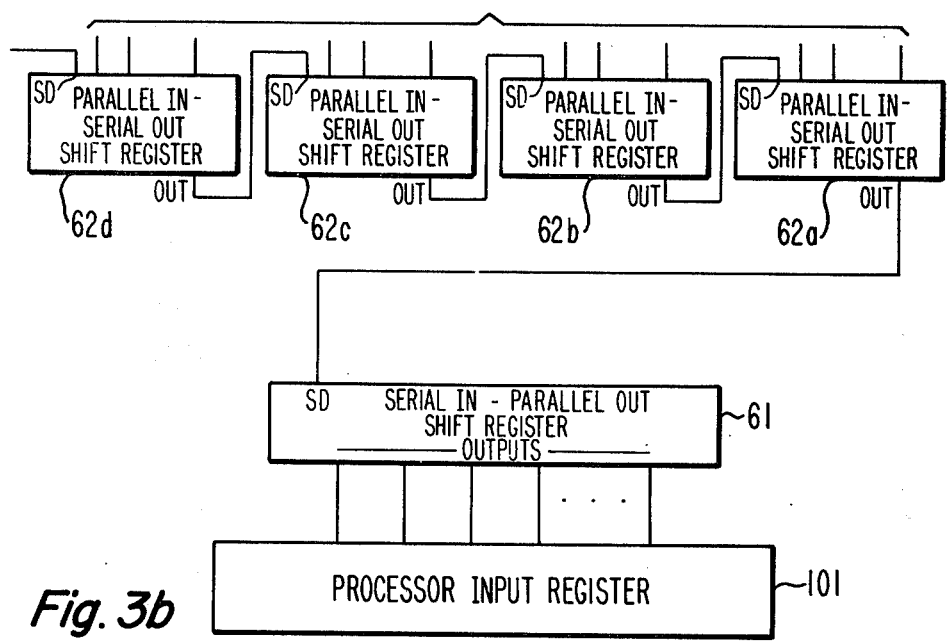
FIG. 3b is a detailed block diagram of a second embodiment of the switch data accumulator of FIG. 1.
Figure 3C:
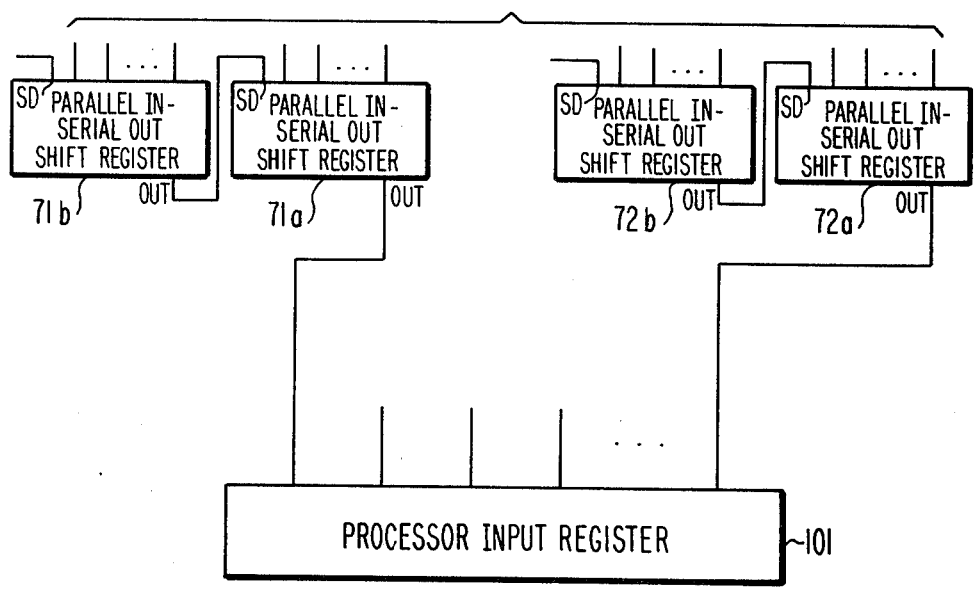
FIG. 3c is a detailed block diagram of a third embodiment of the switch data accumulator of FIG. 1.

FIGS. 3a, 3b, and 3c represent three embodiments of the switch data accumulator 50 (shown in FIG. 1). Each of the embodiments performs the task of reducing a multiplicity of SWITCH DATA signals from a corresponding multiplicity of processor/switch interfaces 10 to a relatively small number of signal lines equal to the number of terminals in the processor input register 101. Each of the embodiments includes the capability of being readily expanded in modular form; in two of the embodiments, those depicted in FIGS. 3b and 3c, the expansion may take place completely independent of processor hardware addressing.

In many pieces of electronic equipment having a large number of front panel switches and indicators, notably test bed fixtures, a large percentage of the panel interface design investment centers around the circuitry involved in channeling the switch status data to the process controller. Further, a design enhancement or a modification in the test bed fixture to accommodate additional units under test may entail a significant redesign of the equipment.

The reason for the complexity of modifications of the status return circuitry may be found in the nature of the status bit decoding procedure employed in conventional circuitry. Where a design change necessitates increasing the number of processor decode lines, significant hardware and software restructuring are usually required. Even where medium or large scale integrated circuits perform the decoding function, and design changes are accomplished with a minimum of additional components, there remains the difficulty of restructuring the processor output register format to provide the additional decode lines, rewiring the additional processor decode lines to the new and existing decode logic, and reprogramming the processor I/O routine to address the added lines. Hence, it can be easily seen that modular expansion occurs most readily when the burden of decoding is shifted from hardware to software.

When considering the advantages and disadvantages of the several embodiments of the switch data accumulator 50, factors which should be considered are as follows: (1) modular expandability, (2) complexity of the panel/processor interface, and (3) the speed at which any particular SWITCH DATA line may be accessed.

Turning first to the embodiment depicted in FIG. 3a, the multiplicity of SWITCH DATA signals from processor/switch interfaces 10 is applied, in discrete signal groups, to a plurality of shift registers 53a, 53b, 54a and 54b. In the example, two groups are shown, the first group comprising two parallel in/serial out shift registers 53a and 53b, serially connected. The second group comprises two similar shift registers 54a and 54b, similarly connected. Although only two groups are shown, it will be obvious that any number of groups, however large, may be accommodated. Furthermore, the example shows each group comprising two shift registers which might be eight-bit devices of a type similar to 74LS155 shift registers, but neither the number nor type of register is a limitation. The signals at the serial data output terminal (OUT) of shift registers 53a and 54a are applied to the input terminals (INPUTS) of multiplexer 52 which selects one of the input signals to be coupled through to the output terminal (OUTPUT), depending on the state of the signals applied to the data select (SEL) terminals. Multiplexer 52 has at least as many data input terminals as there are groups of shift registers and it requires at least as many SEL input terminals as the square root of the number of input terminals (with fractional values assuming the next higher integer). For a truly expandable system, there should be a large number of spare input terminals to multiplexer 52 in order to avoid redesign of the processor interface to provide additional DATA SELECT signal paths. The signal at the output terminal of multiplexer 52 is coupled to the input terminal (IN) of a serial in/parallel out shift register 51 which may be of a type similar to 74LS165 shift register.

The signals at the output terminal (OUTPUTS) of shift register 51 are applied to the input terminals of processor input register 101. In this embodiment, shift registers 53a, 53b, 54a, and 54b and multiplexer 52 are located within the panel logic, and shift register 51 is located adjacent the processor input register 101, requiring but a single lead to convey all SWITCH DATA information. A second advantage of this embodiment is the relative rapidity of access of any given switch status, especially when compared with the embodiment of FIG. 3b.

A second embodiment of the SWITCH DATA accumulator 50 is shown in FIG. 3b. This is a simpler arrangement than that shown in FIG. 3a, and it provides many advantages. A plurality of parallel in/serial out shift registers 62a, 62b, 62c, and 62d, which may be of a type similar to 74LS165 shift registers, are serially connected, each having its serial data input terminal (SD) fed from the serial data output terminal (OUT) of the previous shift register. The output terminal of shift register 62a is coupled to the serial data input terminal (SD) of a serial in/parallel out shift register 1, which may be of a type similar to a 74LS164 shift register. The parallel data output terminals (OUTPUTS) of shift register 61 are coupled respectively to the input terminals of processor input register 101.

In operation, SWITCH DATA signals, applied to the multiplicity of parallel data input terminals of shift registers 62a, 62b, 62c, and 62d, are read into the shift registers. The data is then propagated through the serially-connected shift registers 62a, 62b, 62c, and 62d into shift register 61 until the appropriate data is positioned in correspondence with the input terminals of processor input register 101. Hence, it can be seen that the SWITCH DATA signals need only be loaded into the serial combination of shift registers 62a, 62b, 62c, and 62d, once, and the data can be propagated through the shift registers in incremental steps corresponding to the number of input terminals of processor input register 101.

The advantages of this embodiment are manifold. By placing shift register 61 in physical correspondence with processor input register 101, and shift register 62a, 62b, 62c, and 62d in physical correspondence with processor/switch interfaces 10, only a single lead coupling the processor/switch interfaces 10 and the processor input register 101 is required. Further, this embodiment provides unlimited expansion capability merely by adding serially-connected shift registers, of a type similar to shift registers 62a through 62d, coupled at the serial data (SD) input terminal of shift register 62d. One disadvantage of this embodiment is the danger of the effect of an extraneous or missed clock pulse on the processing of the entire string of data, which includes the SWITCH DATA signals from all of the processor/switch interfaces 10. A second disadvantage is the inability of the processor to quickly access the switch status of a designated processor/switch interface 10, if that interface 10 is connected at a distant position in the serial data shift register stream.

The final embodiment of switch data accumulator 50 to be discussed in detail herein is shown in FIG. 3c. Groups of serially-connected parallel in/serial out shift registers 71a, 71b, and 72a, 72b have their output terminals (OUT) coupled to the input terminals of processor input register 101. SWITCH DATA signals are read into shift registers 71a, 71b, 72a, and 72b and are then shifted directly into processor input register 101. This embodiment employs the least number of circuit elements, but it requires more signal lines between the switch panel and the processor than do the embodiments of FIGS. 3a and 3b. Like the embodiment of FIG. 3b, it has unlimited expansion capabilities by connecting additional shift registers at the serial data (SD) inputs of shift registers 71b and 72b.

Although neither the shift register clocking nor the means for parallel loading the serially-connected shift registers of the embodiments of FIGS. 3a, 3b, and 3c is explicitly shown, the implementation of those incidental matters is conventional and within the skill of the art.

What is claimed is:

1. In a system which includes a plurality of switches and indicator means associated with each switch, in combination:
means responsive to the actuation of solely one of the switches for causing the indicator means associated therewith to change from a first to a second condition; and means responsive to the concurrent actuation of more than one of the switches for preventing the respective indicator means associated with said more than one switch from being changed in condition.

2. The system as set forth in claim 1, further including:

means associated with each switch and responsive to the actuation thereof for producing an output signal to so indicate; and means responsive to the concurrent presence of more than one output signal for preventing the respective indicator means for the switches which are actuated from being changed in condition.

3. In a system as set forth in claim 2, said means responsive to the concurrent presence of more than one output signal comprising:

storage means for storing said signals; and means including logic means responsive to said signals when more than one output signal is present for applying a signal manifestation to the respective indicator means for the switches which have been actuated of a sense to prevent said respective indicator means from being changed in condition.

4. An apparatus which provides an interface between a pushbutton switch having an illuminable indicator and a software-programmable signal processor, said apparatus permitting processor control over the effect of manual actuation of said switch and over the illumination of said indicator, said apparatus comprising:

means having input terminals and an output terminal for generating a signal on said output terminal to said processor indicative of a manual actuation of said switch, said generator means assuming first and second output states corresponding, respectively, to first and second voltage levels of the signal at said output terminal, said means responsive to actuation of said switch to change output states and responsive to signals from said processor to select output states;

means for controlling illumination of said indicator in response to a signal from said processor; and means responsive to selected signals from said processor for generating a signal which inhibits illumination of said indicator and which prevents a change in state of said first-mentioned generating means in response to manual actuation of said switch.

5. The apparatus according to claim 4 further including a flip-flop coupled to said switch to provide a switch actuation signal to said first-mentioned means which is free of indications of switch contact bounce.

6. In combination, a first plurality of the apparatus as set forth in claim 4 and means for accumulating said signals indicative of a manual actuation of said switch into a number of signal paths no greater than the number of input terminals of said processor, said accumulator means comprising:

n shift registers each of the type having m parallel-entry input terminals and having an output terminal, wherein n times m is equal to said first plurality, said input terminals of said shift registers coupled respectively to the output terminals of said first-mentioned generating means;

a shift register of the type having a serial-entry input terminal and having a second plurality of output terminals;

means having n input terminals and an output terminal and responsive to control signals from said processor for coupling the signal at a selected one of the output terminals of said n shift registers to the input terminal of said second-mentioned shift register; and means for coupling said second plurality of output terminals of said second-mentioned shift register to the input terminals of said processor.

7. The apparatus according to claim 6 wherein m is equal to said second plurality.

8. In combination, a first plurality of the apparatus as set forth in claim 4 and means for accumulating said signals indicative of manual actuation of said switch into a number of signal paths no greater than the number of input terminals of said processor, said accumulator means comprising:

a shift register of the type having a first plurality of parallel-entry input terminals and having an output terminal, said first plurality of input terminals coupled respectively to the output terminals of said first-mentioned generating means;

a shift register of the type having a serial-entry input terminal and a second plurality of output terminals, said second plurality less than said first plurality, and said input terminal of said second-mentioned shift register coupled to the output terminal of said first-mentioned shift register; and means for coupling said second plurality of output terminals respectively to the input terminals of said processor.

9. The apparatus according to claim 8 wherein said first-mentioned shift register includes a serial-entry input terminal for coupling to an output terminal of a shift register of a type similar to said first-mentioned shift register.

10. In combination, a first plurality of the apparatus as set forth in claim 4 and means for accumulating said signals indicative of a manual actuation of said switch into a number of signal paths no greater than the number of input terminals of said processor, said accumulator means comprising:

n shift registers each of the type having m parallel-entry input terminals and having an output terminal, wherein n times m is equal to said first plurality, said input terminals of said shift registers coupled respectively to the output terminals of said first-mentioned generating means; and means for coupling the output terminals of said n shift registers respectively to the input terminals of said processor.

11. The apparatus according to claim 10 wherein each of said n shift registers includes a serial-entry input terminal for coupling to an output terminal of a shift register of a type similar to said first-mentioned shift register.

12. In a system which includes switches for indicating functions to be performed, and respective indicator means associated with said switches for indicating in one condition that the function associated with a switch is being performed and in another condition for indicating that the function is not being performed, in combination:

means responsive to the actuation of solely one of the switches for initiating the function called for by said one switch and for causing the indicator means associated therewith to change to said one condition; processor means; and means including said processor means responsive to the concurrent actuation of more than one of said switches for preventing the respective indicator means for the concurrently actuated switches from changing their condition and for correspondingly preventing the functions called for by these concurrently actuated switches from being performed.

13. The system as set forth in claim 12, further including:

means independent of the switch means responsive to the processor means for changing the condition of an indicator means to indicate the status of the function, that is, whether or not it is being performed, associated with the switch for that indicator means.

14. The system as set forth in claim 12, further including:

means associated with each switch and responsive to the actuation thereof for producing an output signal to so indicate; and means responsive to said processor means for preventing the production of said output signal.

* * * * *